United States Patent
Manlapat et al.

(10) Patent No.: US 9,934,045 B1
(45) Date of Patent: Apr. 3, 2018

(54) EMBEDDED SYSTEM BOOT FROM A STORAGE DEVICE

(71) Applicant: BiTMICRO Networks, Inc., Fremont, CA (US)

(72) Inventors: Alvin Anonuevo Manlapat, San Fernando (PH); Ian Victor Pasion Beleno, Quezon (PH)

(73) Assignee: BiTMICRO Networks, Inc., Fremont, CA (US)

(*) Notice: Subject to any disclaimer, the term of this patent is extended or adjusted under 35 U.S.C. 154(b) by 125 days.

(21) Appl. No.: 14/684,399

(22) Filed: Apr. 12, 2015

Related U.S. Application Data

(63) Continuation-in-part of application No. 14/217,365, filed on Mar. 17, 2014.

(60) Provisional application No. 61/980,564, filed on Apr. 16, 2014, provisional application No. 61/801,952, filed on Mar. 15, 2013.

(51) Int. Cl.
| | |
|---|---|
| *G06F 1/12* | (2006.01) |
| *G06F 9/44* | (2006.01) |
| *G06F 1/24* | (2006.01) |
| *G06F 12/02* | (2006.01) |
| *G11C 7/10* | (2006.01) |

(52) U.S. Cl.
CPC .............. *G06F 9/4401* (2013.01); *G06F 1/24* (2013.01); *G06F 12/0246* (2013.01); *G11C 7/1072* (2013.01); *G06F 2212/7201* (2013.01)

(58) Field of Classification Search
CPC .............. G06F 1/12; G06F 1/24; G06F 9/4401
See application file for complete search history.

(56) References Cited

U.S. PATENT DOCUMENTS

| | | |
|---|---|---|
| 4,402,040 A | 8/1983 | Evett |
| 4,403,283 A | 9/1983 | Myntti et al. |
| 4,752,871 A | 6/1988 | Sparks |
| 4,967,344 A | 10/1990 | Scavezze et al. |
| 5,111,058 A | 5/1992 | Martin |

(Continued)

FOREIGN PATENT DOCUMENTS

| | | |
|---|---|---|
| JP | 2005142859 A | 6/2005 |
| JP | 2005-309847 | 11/2005 |

(Continued)

OTHER PUBLICATIONS

Notice of allowance/allowability for U.S. Appl. No. 14/803,107 dated Mar. 28, 2016.

(Continued)

*Primary Examiner* — Abdelmoniem Elamin

(57) ABSTRACT

In an embodiment of the invention, an apparatus comprises an embedded system comprising: a processor configured to execute firmware; a random access memory (RAM) configured to store firmware and a multi-port memory controller configured to interface with the RAM; a power-on reset (POR) sequencer configured to control a boot process of the embedded system; a nonvolatile memory configured to store data used by the POR sequencer in the boot process and a nonvolatile memory controller configured to interface with the nonvolatile memory; a direct memory access (DMA) controller configured initiate and track data transfers; and a configuration and status register (CSR) controller configured to access modules in the embedded system.

9 Claims, 10 Drawing Sheets

(56) References Cited

U.S. PATENT DOCUMENTS

| | | |
|---|---|---|
| 5,222,046 A | 6/1993 | Kreifels et al. |
| 5,297,148 A | 3/1994 | Harari et al. |
| 5,339,404 A | 8/1994 | Vandling, III |
| 5,341,339 A | 8/1994 | Wells |
| 5,371,709 A | 12/1994 | Fisher et al. |
| 5,379,401 A | 1/1995 | Robinson et al. |
| 5,388,083 A | 2/1995 | Assar et al. |
| 5,396,468 A | 3/1995 | Harari et al. |
| 5,406,529 A | 4/1995 | Asano |
| 5,432,748 A | 7/1995 | Hsu et al. |
| 5,448,577 A | 9/1995 | Wells et al. |
| 5,459,850 A | 10/1995 | Clay et al. |
| 5,479,638 A | 12/1995 | Assar et al. |
| 5,485,595 A | 1/1996 | Assar et al. |
| 5,488,711 A | 1/1996 | Hewitt et al. |
| 5,500,826 A | 3/1996 | Hsu et al. |
| 5,509,134 A | 4/1996 | Fandrich et al. |
| 5,513,138 A | 4/1996 | Manabe et al. |
| 5,524,231 A | 6/1996 | Brown |
| 5,530,828 A | 6/1996 | Kaki et al. |
| 5,535,328 A | 7/1996 | Harari et al. |
| 5,535,356 A | 7/1996 | Kim et al. |
| 5,542,042 A | 7/1996 | Manson |
| 5,542,082 A | 7/1996 | Solhjell |
| 5,548,741 A | 8/1996 | Watanabe |
| 5,559,956 A | 9/1996 | Sukegawa |
| 5,568,423 A | 10/1996 | Jou et al. |
| 5,568,439 A | 10/1996 | Harari |
| 5,572,466 A | 11/1996 | Sukegawa |
| 5,594,883 A | 1/1997 | Pricer |
| 5,602,987 A | 2/1997 | Harari et al. |
| 5,603,001 A | 2/1997 | Sukegawa et al. |
| 5,606,529 A | 2/1997 | Honma et al. |
| 5,606,532 A | 2/1997 | Lambrache et al. |
| 5,619,470 A | 4/1997 | Fukumoto |
| 5,627,783 A | 5/1997 | Miyauchi |
| 5,640,349 A | 6/1997 | Kakinuma et al. |
| 5,644,784 A | 7/1997 | Peek |
| 5,682,509 A | 10/1997 | Kabenjian |
| 5,737,742 A | 4/1998 | Achiwa et al. |
| 5,765,023 A | 6/1998 | Leger et al. |
| 5,787,466 A | 7/1998 | Berliner |
| 5,796,182 A | 8/1998 | Martin |
| 5,799,200 A | 8/1998 | Brant et al. |
| 5,802,554 A | 9/1998 | Caceres et al. |
| 5,818,029 A | 10/1998 | Thomson |
| 5,819,307 A | 10/1998 | Iwamoto et al. |
| 5,822,251 A | 10/1998 | Bruce et al. |
| 5,864,653 A | 1/1999 | Tavallaei et al. |
| 5,870,627 A | 2/1999 | O'Toole et al. |
| 5,875,351 A | 2/1999 | Riley |
| 5,881,264 A | 3/1999 | Kurosawa |
| 5,918,033 A | 6/1999 | Heeb et al. |
| 5,933,849 A | 8/1999 | Srbljic et al. |
| 5,943,421 A | 8/1999 | Grabon |
| 5,956,743 A | 9/1999 | Bruce et al. |
| 5,978,866 A | 11/1999 | Nain |
| 5,987,621 A | 11/1999 | Duso |
| 6,000,006 A | 12/1999 | Bruce et al. |
| 6,014,709 A | 1/2000 | Gulick et al. |
| 6,098,119 A | 8/2000 | Surugucchi et al. |
| 6,128,303 A * | 10/2000 | Bergantino ........ H04Q 11/0478 370/398 |
| 6,138,200 A | 10/2000 | Ogilvie |
| 6,138,247 A | 10/2000 | McKay et al. |
| 6,151,641 A | 11/2000 | Herbert |
| 6,215,875 B1 | 4/2001 | Nohda |
| 6,230,269 B1 | 5/2001 | Spies et al. |
| 6,298,071 B1 | 10/2001 | Taylor et al. |
| 6,341,342 B1 | 1/2002 | Thompson et al. |
| 6,363,441 B1 | 3/2002 | Beniz et al. |
| 6,363,444 B1 | 3/2002 | Platko et al. |
| 6,397,267 B1 | 5/2002 | Chong, Jr. |
| 6,404,772 B1 | 6/2002 | Beach et al. |
| 6,452,602 B1 | 9/2002 | Morein |
| 6,496,939 B2 | 12/2002 | Portman et al. |
| 6,526,506 B1 | 2/2003 | Lewis |
| 6,529,416 B2 | 3/2003 | Bruce et al. |
| 6,557,095 B1 | 4/2003 | Henstrom |
| 6,574,142 B2 | 6/2003 | Gelke |
| 6,601,126 B1 | 7/2003 | Zaidi et al. |
| 6,678,754 B1 | 1/2004 | Soulier |
| 6,728,840 B1 | 4/2004 | Shatil et al. |
| 6,744,635 B2 | 6/2004 | Portman et al. |
| 6,785,746 B1 | 8/2004 | Mahmoud et al. |
| 6,757,845 B2 | 12/2004 | Bruce |
| 6,857,076 B1 | 2/2005 | Klein |
| 6,901,499 B2 | 5/2005 | Aasheim et al. |
| 6,922,391 B1 | 7/2005 | King et al. |
| 6,970,446 B2 | 11/2005 | Krischar et al. |
| 6,970,890 B1 | 11/2005 | Bruce et al. |
| 6,973,546 B2 | 12/2005 | Johnson |
| 6,980,795 B1 | 12/2005 | Hermann et al. |
| 7,103,684 B2 | 9/2006 | Chen et al. |
| 7,174,438 B2 | 2/2007 | Homma et al. |
| 7,194,766 B2 | 3/2007 | Noehring et al. |
| 7,283,629 B2 | 10/2007 | Kaler et al. |
| 7,305,548 B2 | 12/2007 | Pierce et al. |
| 7,372,962 B2 | 6/2008 | Fujimoto et al. |
| 7,386,662 B1 | 6/2008 | Kekre et al. |
| 7,412,631 B2 | 8/2008 | Uddenberg et al. |
| 7,415,549 B2 | 8/2008 | Vemula et al. |
| 7,424,553 B1 | 9/2008 | Borrelli et al. |
| 7,430,650 B1 | 9/2008 | Ross |
| 7,474,926 B1 | 1/2009 | Carr et al. |
| 7,478,186 B1 | 1/2009 | Onufryk et al. |
| 7,490,177 B2 | 2/2009 | Kao |
| 7,496,699 B2 | 2/2009 | Pope et al. |
| 7,500,063 B2 | 3/2009 | Zohar et al. |
| 7,506,098 B2 | 3/2009 | Arcedera et al. |
| 7,613,876 B2 | 11/2009 | Bruce et al. |
| 7,620,748 B1 | 11/2009 | Bruce et al. |
| 7,620,749 B2 | 11/2009 | Biran et al. |
| 7,636,801 B1 | 12/2009 | Kekre et al. |
| 7,660,941 B2 | 2/2010 | Lee et al. |
| 7,668,925 B1 | 2/2010 | Liao et al. |
| 7,676,640 B2 * | 3/2010 | Chow ..................... G06F 8/665 711/157 |
| 7,681,188 B1 | 3/2010 | Tirumalai et al. |
| 7,716,389 B1 | 5/2010 | Bruce et al. |
| 7,719,287 B2 | 5/2010 | Marks et al. |
| 7,729,370 B1 | 6/2010 | Orcine et al. |
| 7,743,202 B2 | 6/2010 | Tsai et al. |
| 7,765,359 B2 | 7/2010 | Kang et al. |
| 7,877,639 B2 | 1/2011 | Hoang |
| 7,913,073 B2 * | 3/2011 | Choi ..................... G06F 9/4401 713/1 |
| 7,921,237 B1 | 4/2011 | Holland et al. |
| 7,934,052 B2 | 4/2011 | Prins et al. |
| 7,958,295 B1 | 6/2011 | Liao et al. |
| 7,979,614 B1 | 7/2011 | Yang |
| 7,996,581 B2 | 8/2011 | Bond et al. |
| 8,010,740 B2 | 10/2011 | Arcedera et al. |
| 8,032,700 B2 | 10/2011 | Bruce et al. |
| 8,156,279 B2 | 4/2012 | Tanaka et al. |
| 8,156,320 B2 * | 4/2012 | Borras ................. G06F 9/4401 711/103 |
| 8,161,223 B1 | 4/2012 | Chamseddine et al. |
| 8,165,301 B1 | 4/2012 | Bruce et al. |
| 8,200,879 B1 | 6/2012 | Falik et al. |
| 8,219,719 B1 | 7/2012 | Parry et al. |
| 8,225,022 B2 | 7/2012 | Caulkins |
| 8,341,300 B1 | 12/2012 | Karamcheti |
| 8,341,311 B1 | 12/2012 | Szewerenko et al. |
| 8,447,908 B2 | 5/2013 | Bruce et al. |
| 8,489,914 B2 | 7/2013 | Cagno |
| 8,560,804 B2 | 10/2013 | Bruce et al. |
| 8,583,868 B2 | 11/2013 | Belluomini et al. |
| 8,677,042 B2 | 3/2014 | Gupta et al. |
| 8,713,417 B2 | 4/2014 | Jo |
| 8,762,609 B1 | 6/2014 | Lam et al. |
| 8,788,725 B2 | 7/2014 | Bruce et al. |
| 8,832,371 B2 | 9/2014 | Uehara et al. |
| 8,856,392 B2 | 10/2014 | Myrah et al. |

(56) References Cited

U.S. PATENT DOCUMENTS

| | | |
|---|---|---|
| 8,959,307 B1 | 2/2015 | Bruce et al. |
| 9,043,669 B1 | 5/2015 | Bruce et al. |
| 9,099,187 B2 | 8/2015 | Bruce et al. |
| 9,135,190 B1 | 9/2015 | Bruce et al. |
| 9,158,661 B2 | 10/2015 | Blaine et al. |
| 9,201,790 B2 | 12/2015 | Keeler |
| 9,400,617 B2 | 7/2016 | Ponce et al. |
| 2002/0011607 A1 | 1/2002 | Gelke et al. |
| 2002/0013880 A1 | 1/2002 | Gappisch et al. |
| 2002/0044486 A1 | 4/2002 | Chan et al. |
| 2002/0073324 A1 | 6/2002 | Hsu et al. |
| 2002/0083262 A1 | 6/2002 | Fukuzumi |
| 2002/0083264 A1 | 6/2002 | Coulson |
| 2002/0141244 A1 | 10/2002 | Bruce et al. |
| 2003/0023817 A1 | 1/2003 | Rowlands et al. |
| 2003/0065836 A1 | 4/2003 | Pecone |
| 2003/0097248 A1 | 5/2003 | Terashima et al. |
| 2003/0120864 A1 | 6/2003 | Lee et al. |
| 2003/0126451 A1 | 7/2003 | Gorobets |
| 2003/0131201 A1 | 7/2003 | Khare et al. |
| 2003/0161355 A1 | 8/2003 | Falcomato et al. |
| 2003/0163624 A1 | 8/2003 | Matsui et al. |
| 2003/0163647 A1 | 8/2003 | Cameron et al. |
| 2003/0163649 A1 | 8/2003 | Kapur et al. |
| 2003/0182576 A1 | 9/2003 | Morlang et al. |
| 2003/0188100 A1 | 10/2003 | Solomon et al. |
| 2003/0204675 A1 | 10/2003 | Dover et al. |
| 2003/0217202 A1 | 11/2003 | Zilberman et al. |
| 2003/0223585 A1 | 12/2003 | Tardo et al. |
| 2004/0073721 A1 | 4/2004 | Goff et al. |
| 2004/0078632 A1 | 4/2004 | Infante et al. |
| 2004/0128553 A1 | 7/2004 | Buer et al. |
| 2004/0215868 A1 | 10/2004 | Solomon et al. |
| 2005/0050245 A1 | 3/2005 | Miller et al. |
| 2005/0055481 A1 | 3/2005 | Chou et al. |
| 2005/0078016 A1 | 4/2005 | Neff |
| 2005/0097368 A1 | 5/2005 | Peinado et al. |
| 2005/0120146 A1 | 6/2005 | Chen et al. |
| 2005/0210149 A1 | 9/2005 | Kimball |
| 2005/0210159 A1 | 9/2005 | Voorhees et al. |
| 2005/0226407 A1 | 10/2005 | Kasuya et al. |
| 2005/0240707 A1 | 10/2005 | Hayashi et al. |
| 2005/0243610 A1 | 11/2005 | Guha et al. |
| 2005/0289361 A1 | 12/2005 | Sutardja |
| 2006/0004957 A1 | 1/2006 | Hand, III et al. |
| 2006/0026329 A1 | 2/2006 | Yu |
| 2006/0031450 A1 | 2/2006 | Unrau et al. |
| 2006/0039406 A1 | 2/2006 | Day et al. |
| 2006/0064520 A1 | 3/2006 | Anand et al. |
| 2006/0095709 A1 | 5/2006 | Achiwa |
| 2006/0112251 A1 | 5/2006 | Karr et al. |
| 2006/0129876 A1 | 6/2006 | Uemura |
| 2006/0173970 A1 | 8/2006 | Pope et al. |
| 2007/0019573 A1 | 1/2007 | Nishimura |
| 2007/0028040 A1 | 2/2007 | Sinclair |
| 2007/0058478 A1 | 3/2007 | Murayama |
| 2007/0073922 A1 | 3/2007 | Go et al. |
| 2007/0079017 A1 | 4/2007 | Brink et al. |
| 2007/0083680 A1 | 4/2007 | King et al. |
| 2007/0088864 A1 | 4/2007 | Foster |
| 2007/0093124 A1 | 4/2007 | Varney et al. |
| 2007/0094450 A1 | 4/2007 | VanderWiel |
| 2007/0096785 A1 | 5/2007 | Maeda |
| 2007/0121499 A1 | 5/2007 | Pal et al. |
| 2007/0130439 A1 | 6/2007 | Andersson et al. |
| 2007/0159885 A1 | 7/2007 | Gorobets |
| 2007/0168754 A1 | 7/2007 | Zohar et al. |
| 2007/0174493 A1 | 7/2007 | Irish et al. |
| 2007/0180223 A1 | 8/2007 | Tanaka |
| 2007/0195957 A1 | 8/2007 | Arulambalam et al. |
| 2007/0288686 A1 | 12/2007 | Arcedera et al. |
| 2007/0288692 A1 | 12/2007 | Bruce et al. |
| 2007/0294572 A1 | 12/2007 | Kalwitz et al. |
| 2008/0005481 A1 | 1/2008 | Walker |
| 2008/0052456 A1 | 2/2008 | Ash et al. |
| 2008/0052585 A1 | 2/2008 | LaBerge et al. |
| 2008/0072031 A1 | 3/2008 | Choi |
| 2008/0104264 A1 | 5/2008 | Duerk et al. |
| 2008/0140724 A1 | 6/2008 | Flynn et al. |
| 2008/0147963 A1 | 6/2008 | Tsai et al. |
| 2008/0189466 A1 | 8/2008 | Hemmi |
| 2008/0195800 A1 | 8/2008 | Lee et al. |
| 2008/0218230 A1 | 9/2008 | Shim |
| 2008/0228959 A1 | 9/2008 | Wang |
| 2008/0276037 A1 | 11/2008 | Chang et al. |
| 2008/0301256 A1 | 12/2008 | McWilliams et al. |
| 2009/0028229 A1 | 1/2009 | Cagno et al. |
| 2009/0037565 A1 | 2/2009 | Andresen et al. |
| 2009/0055573 A1 | 2/2009 | Ito |
| 2009/0077306 A1 | 3/2009 | Arcedera et al. |
| 2009/0083022 A1* | 3/2009 | Bin Mohd Nordin .......... G06F 9/4401 703/25 |
| 2009/0094411 A1 | 4/2009 | Que |
| 2009/0132620 A1 | 5/2009 | Arakawa |
| 2009/0132752 A1 | 5/2009 | Poo et al. |
| 2009/0150643 A1 | 6/2009 | Jones et al. |
| 2009/0158085 A1 | 6/2009 | Kern et al. |
| 2009/0172250 A1 | 7/2009 | Allen et al. |
| 2009/0172261 A1 | 7/2009 | Prins et al. |
| 2009/0240873 A1 | 9/2009 | Yu et al. |
| 2010/0058045 A1* | 3/2010 | Borras .......... G06F 9/44573 713/2 |
| 2010/0095053 A1 | 4/2010 | Bruce et al. |
| 2010/0125695 A1 | 5/2010 | Wu et al. |
| 2010/0250806 A1 | 9/2010 | Devilla et al. |
| 2010/0268904 A1 | 10/2010 | Sheffield et al. |
| 2010/0299538 A1 | 11/2010 | Miller |
| 2010/0318706 A1 | 12/2010 | Kobayashi |
| 2011/0022778 A1 | 1/2011 | Schibilla et al. |
| 2011/0022783 A1 | 1/2011 | Moshayedi |
| 2011/0022801 A1 | 1/2011 | Flynn |
| 2011/0087833 A1 | 4/2011 | Jones |
| 2011/0093648 A1 | 4/2011 | Belluomini et al. |
| 2011/0113186 A1 | 5/2011 | Bruce et al. |
| 2011/0133826 A1 | 6/2011 | Jones et al. |
| 2011/0145479 A1 | 6/2011 | Talagala et al. |
| 2011/0161568 A1 | 6/2011 | Bruce et al. |
| 2011/0167204 A1 | 7/2011 | Estakhri et al. |
| 2011/0173383 A1 | 7/2011 | Gorobets |
| 2011/0197011 A1 | 8/2011 | Suzuki et al. |
| 2011/0202709 A1 | 8/2011 | Rychlik |
| 2011/0208901 A1 | 8/2011 | Kim et al. |
| 2011/0208914 A1 | 8/2011 | Winokur et al. |
| 2011/0219150 A1 | 9/2011 | Piccirillo et al. |
| 2011/0258405 A1 | 10/2011 | Asaki et al. |
| 2011/0264884 A1 | 10/2011 | Kim |
| 2011/0264949 A1 | 10/2011 | Ikeuchi et al. |
| 2011/0270979 A1 | 11/2011 | Schlansker et al. |
| 2012/0005405 A1 | 1/2012 | Wu et al. |
| 2012/0005410 A1 | 1/2012 | Ikeuchi |
| 2012/0017037 A1 | 1/2012 | Riddle et al. |
| 2012/0079352 A1 | 3/2012 | Frost et al. |
| 2012/0102263 A1 | 4/2012 | Aswadhati |
| 2012/0102268 A1 | 4/2012 | Smith et al. |
| 2012/0137050 A1 | 5/2012 | Wang et al. |
| 2012/0159029 A1 | 6/2012 | Krishnan et al. |
| 2012/0161568 A1 | 6/2012 | Umemoto et al. |
| 2012/0173795 A1 | 7/2012 | Schuette et al. |
| 2012/0215973 A1 | 8/2012 | Cagno et al. |
| 2012/0249302 A1 | 10/2012 | Szu |
| 2012/0260102 A1 | 10/2012 | Zaks et al. |
| 2012/0271967 A1 | 10/2012 | Hirschman |
| 2012/0303924 A1 | 11/2012 | Ross |
| 2012/0311197 A1 | 12/2012 | Larson et al. |
| 2012/0324277 A1 | 12/2012 | Weston-Lewis et al. |
| 2013/0010058 A1 | 1/2013 | Pomeroy |
| 2013/0019053 A1 | 1/2013 | Somanache et al. |
| 2013/0094312 A1 | 4/2013 | Jang et al. |
| 2013/0099838 A1 | 4/2013 | Kim et al. |
| 2013/0111135 A1 | 5/2013 | Bell, Jr. et al. |
| 2013/0206837 A1 | 8/2013 | Szu |
| 2013/0208546 A1 | 8/2013 | Kim et al. |
| 2013/0212337 A1 | 8/2013 | Maruyama |

(56) References Cited

U.S. PATENT DOCUMENTS

| | | |
|---|---|---|
| 2013/0212349 A1 | 8/2013 | Maruyama |
| 2013/0212425 A1 | 8/2013 | Blaine et al. |
| 2013/0246694 A1 | 9/2013 | Bruce et al. |
| 2013/0254435 A1 | 9/2013 | Shapiro et al. |
| 2013/0262750 A1 | 10/2013 | Yamasaki et al. |
| 2013/0282933 A1 | 10/2013 | Jokinen et al. |
| 2013/0304775 A1 | 11/2013 | Davis et al. |
| 2013/0339578 A1 | 12/2013 | Ohya et al. |
| 2013/0339582 A1 | 12/2013 | Olbrich et al. |
| 2013/0346672 A1 | 12/2013 | Sengupta et al. |
| 2014/0068177 A1 | 3/2014 | Raghavan |
| 2014/0095803 A1 | 4/2014 | Kim et al. |
| 2014/0104949 A1 | 4/2014 | Bruce et al. |
| 2014/0108869 A1 | 4/2014 | Brewerton et al. |
| 2014/0189203 A1 | 7/2014 | Suzuki et al. |
| 2014/0258788 A1 | 9/2014 | Maruyama |
| 2014/0285211 A1 | 9/2014 | Raffinan |
| 2014/0331034 A1 | 11/2014 | Ponce et al. |
| 2015/0006766 A1 | 1/2015 | Ponce et al. |
| 2015/0012690 A1 | 1/2015 | Bruce et al. |
| 2015/0032937 A1 | 1/2015 | Salessi |
| 2015/0032938 A1 | 1/2015 | Salessi |
| 2015/0067243 A1 | 3/2015 | Salessi et al. |
| 2015/0149697 A1 | 5/2015 | Salessi et al. |
| 2015/0149706 A1 | 5/2015 | Salessi et al. |
| 2015/0153962 A1 | 6/2015 | Salessi et al. |
| 2015/0169021 A1 | 6/2015 | Salessi et al. |
| 2015/0261456 A1 | 9/2015 | Alcantara et al. |
| 2015/0261475 A1 | 9/2015 | Alcantara et al. |
| 2015/0261797 A1 | 9/2015 | Alcantara et al. |
| 2015/0370670 A1 | 12/2015 | Lu |
| 2015/0371684 A1 | 12/2015 | Mataya |
| 2015/0378932 A1 | 12/2015 | Souri et al. |
| 2016/0026402 A1 | 1/2016 | Alcantara et al. |
| 2016/0027521 A1 | 1/2016 | Lu |
| 2016/0041596 A1 | 2/2016 | Alcantara et al. |

FOREIGN PATENT DOCUMENTS

| | | |
|---|---|---|
| TW | 489308 | 6/2002 |
| TW | 200428219 A | 12/2004 |
| TW | 436689 | 12/2005 |
| TW | I420316 | 12/2013 |
| WO | WO 94/06210 | 3/1994 |
| WO | WO 98/38568 | 9/1998 |

OTHER PUBLICATIONS

Office Action for U.S. Appl. No. 14/217,334 dated Apr. 4, 2016.
Notice of Allowance/Allowability for U.S. Appl. No. 13/890,229 dated Feb. 20, 2014.
Office Action for U.S. Appl. No. 13/890,229 dated Oct. 8, 2013.
Office Action for U.S. Appl. No. 12/876,113 dated Dec. 5, 2014.
Notice of Allowance/Allowabilty for U.S. Appl. No. 12/876,113 dated Jun. 22, 2015.
Office Action for U.S. Appl. No. 14/217,249 dated Apr. 23, 2015.
Office Action for U.S. Appl. No. 14/217,467 dated Apr. 27, 2015.
Office Action for U.S. Appl. No. 14/616,700 dated Apr. 30, 2015.
Office Action for U.S. Appl. No. 14/217,436 dated Sep. 11, 2015.
Robert Cooksey et al., A Stateless, Content-Directed Data Prefetching Mechanism, Copyright 2002 ACM.
Office Action for U.S. Appl. No. 14/866,946 dated Jul. 27 2017.
Office Action for U.S. Appl. No. 14/616,700 dated Jun. 2, 2017.
Office Action for U.S. Appl. No. 15/268,533 dated Jun. 2, 2017 (issued by Examiner in this application).
Office Action for U.S. Appl. No. 15/268,536 dated Apr. 27, 2017.
Office Action for U.S. Appl. No. 15/368,598 dated May 19, 2017.
Office Action for U.S. Appl. No. 13/475,878, dated Jun. 23, 2014.
Office Action for U.S. Appl. No. 13/253,912 dated Jul. 16, 2014.
Office Action for U.S. Appl. No. 12/876,113 dated Jul. 11, 2014.
Office Action for U.S. Appl. No. 12/270,626 dated Feb. 3, 2012.
Office Action for U.S. Appl. No. 12/270,626 dated Apr. 4, 2011.
Office Action for U.S. Appl. No. 12/270,626 dated Mar. 15, 2013.
Notice of Allowance/Allowability for U.S. Appl. No. 12/270,626 dated Oct. 3, 2014.
Advisory Action for U.S. Appl. No. 12/876,113 dated Oct. 16, 2014.
Office Action for U.S. Appl. No. 14/297,628 dated Jul. 17, 2015.
Office Action for U.S. Appl. No. 13/475,878 dated Dec. 4, 2014.
Office Action dated Dec. 5, 2014 for U.S. Appl. No. 14/038,684.
Office Action dated Oct. 8, 2015 for U.S. Appl. No. 14/217,291.
Office Action dated Oct. 5, 2015 for Taiwanese Application No. 103105076.
Office Action dated Nov. 19, 2015 for U.S. Appl. No. 14/217,249.
Office Action dated Nov. 18, 2015 for U.S. Appl. No. 14/217,467.
Office Action dated Dec. 4, 2015 for U.S. Appl. No. 14/616,700.
Office Action dated Jun. 4, 2015 for U.S. Appl. No. 14/215,414.
Office Action for U.S. Appl. No. 14/217,291 dated Jun. 15, 2016.
Final Office Action dated Nov. 19, 2015 for U.S. Appl. No. 14/217,249.
Final Office Action dated Nov. 18, 2015 for U.S. Appl. No. 14/217,467.
Office Action dated Nov. 25, 2015 for U.S. Appl. No. 14/217,041.
Notice of allowance/allowability for U.S. Appl. No. 14/217,041 dated Apr. 11, 2016.
Office Action for U.S. Appl. No. 14/215,414 dated May 20, 2016.
Office Action for U.S. Appl. No. 14/616,700 dated May 20, 2016.
Office Action for U.S. Appl. No. 14/689,019 dated May 20, 2016.
Advisory Action for U.S. Appl. No. 14/217,316 dated May 19, 2016.
Notice of allowance/allowability for U.S. Appl. No. 14/217,365 dated Oct. 18, 2016.
Office Action dated Sep. 11, 2015 for U.S. Appl. No. 14/217,436.
Office Action dated Sep. 24, 2015 for U.S. Appl. No. 14/217,334.
Office Action dated Sep. 18, 2015 for Taiwanese Patent Application No. 102144165.
Office Action dated Sep. 29, 2015 for U.S. Appl. No. 14/217,316.
Office Action dated Sep. 28, 2015 for U.S. Appl. No. 14/689,045.
Office Action dated Dec. 15, 2015 for U.S. Appl. No. 13/253,912.
Office Action dated Dec. 17, 2015 for U.S. Appl. No. 14/214,216.
Office Action dated Dec. 17, 2015 for U.S. Appl. No. 14/215,414.
Office Action dated Dec. 17, 2015 for U.S. Appl. No. 14/803,107.
Office Action dated Jan. 15, 2016 for U.S. Appl. No. 14/866,946.
Office Action dated Jan. 11, 2016 for U.S. Appl. No. 14/217,399.
Office Action dated Jan. 15, 2016 for U.S. Appl. No. 14/216,937.
Notice of Allowance and Examiner-Initiated Interview Summary, dated Jan. 29, 2016 for U.S. Appl. No. 14/297,628.
Office Action for U.S. Appl. No. 14/217,365 dated Feb. 18, 2016.
Office Action for U.S. Appl. No. 14/217,365 dated Mar. 2, 2016.
Office Action for U.S. Appl. No. 14/690,305 dated Feb. 25, 2016.
Office Action for U.S. Appl. No. 14/217,436 dated Feb. 25, 2016.
Office Action for U.S. Appl. No. 14/217,316 dated Feb. 26, 2016.
Office Action for U.S. Appl. No. 14/215,414 dated Mar. 1, 2016.
Office Action for U.S. Appl. No. 14/616,700 dated Mar. 8, 2016.
Advisory Action for U.S. Appl. No. 14/217,334 dated Jun. 13, 2016.
Office Action for U.S. Appl. No. 14/217,096 dated Jul. 12, 2016.
Notice of Allowance for U.S. Appl. No. 14/217,399 dated Jul. 20, 2016 (Mailed in this current application).
Office Action for U.S. Appl. No. 14/866,946 dated Jul. 29, 2016.
Notice of Allowance for U.S. Appl. No. 14/217,334 dated Jul. 29, 2016.
Office Action for U.S. Appl. No. 14/690,243 dated Aug. 11, 2016.
Office Action for U.S. Appl. No. 14/690,370 dated Aug. 12, 2016.
Office Action for U.S. Appl. No. 14/216,937 dated Aug. 15, 2016.
Working Draft American National Standard Project T10/1601-D Information Technology Serial Attached SCSI—1.1 (SAS—1.1), Mar. 13, 2004 Revision 4.
Notice of allowance/allowability for U.S. Appl. No. 13/253,912 dated Mar. 21, 2016.
Office Action for U.S. Appl. No. 14/616,700 dated Oct. 20, 2016.
USPTO Notice of Allowability & attachment(s) dated Jan. 2013 for U.S. Appl. No. 12/876,247.
Office Action dated Sep. 14, 2012 for U.S. Appl. No. 12/876,247.
Office Action dated Feb. 1, 2012 for U.S. Appl. No. 12/876,247.
Notice of Allowance/Allowability dated Mar. 31, 2015 for U.S. Appl. No. 13/475,878.

(56) References Cited

OTHER PUBLICATIONS

Office Action dated May 2015 for U.S. Appl. No. 13/253,912.
Notice of Allowance for U.S. Appl. No. 14/215,414 dated Jan. 20, 2017.
Advisory Action for U.S. Appl. No. 14/217,249 dated Jan. 26, 2017.
Notice of Allowance for U.S. Appl. No. 14/687,700 dated Jan. 27, 2016.
Office Action for U.S. Appl. No. 14/690,339 dated Feb. 3, 2017.
Office Action for U.S. Appl. No. 14/616,700 dated Feb. 9, 2017.
Notice of Allowance for U.S. Appl. No. 14/217,365 dated Feb. 10, 2017.
Office Action for U.S. Appl. No. 14/690,305 dated Feb. 10, 2017.
Office Action for U.S. Appl. No. 14/690,349 dated Feb. 8, 2017.
Advisory Action for U.S. Appl. No. 14/689,019 dated Feb. 17, 2017.
Office Action for U.S. Appl. No. 14/690,349 dated Feb. 27, 2017.
National Science Fountation,Award Abstract #1548968, SBIR Phase I: SSD In-Situ Processing, http://www.nsf.gov/awardsearch/showAward?AWD_ID=1548968 printed on Feb. 13, 2016.
Design-Reuse, NxGn Data Emerges from Stealth Mode to provide a paradigm shift in enterprise storage solution. http://www.design-reuse.com/news/35111/nxgn-data-intelligent-solutions.html, printed on Feb. 13, 2016.
Office Action for U.S. Appl. No. 14/217,316 dated Aug. 25, 2016.
Office Action for U.S. Appl. No. 14/690,305 dated Aug. 26, 2016.
Advisory Action for U.S. Appl. No. 14/217,291 dated Sep. 9, 2016.
Advisory Action for U.S. Appl. No. 14/689,045 dated Sep. 16, 2016.
Notice of Allowance for U.S. Appl. No. 14/182,303 dated Sep. 12, 2016.
Advisory Action for U.S. Appl. No. 14/690,114 dated Sep. 12, 2016.
Notice of Allowance for U.S. Appl. No. 14/215,414 dated Sep. 23, 2016.
Advisory Action for U.S. Appl. No. 14/866,946 dated Oct. 13, 2016.
Office Action for U.S. Appl. No. 14/687,700 dated Sep. 26, 2016.
Office Action for U.S. Appl. No. 15/170,768 dated Oct. 6, 2016.
Office Action for U.S. Appl. No. 13/475,878 dated Jun. 23, 2014.
Office Action for U.S. Appl. No. 12/876,113 dated Oct. 16, 2014.
Notice of Allowance for U.S. Appl. No. 12/270,626 dated Oct. 3, 2014.
Office Action for U.S. Appl. No. 12/270,626 dated May 23, 2014.
Office Action for U.S. Appl. No. 12/270,626 dated Dec. 18, 2013.
Office Action for U.S. Appl. No. 12/270,626 dated Aug. 23, 2012.
Office Action for U.S. Appl. No. 12/876,113 dated Mar. 13, 2014.
Advisory Action for U.S. Appl. No. 12/876,113 dated Sep. 6, 2013.
Office Action for U.S. Appl. No. 12/876,113 dated May 14, 2013.
Office Action for U.S. Appl. No. 12/876,113 dated Dec. 21, 2012.
Security Comes to SNMP: The New SNMPv3 Proposed Internet Standard, The Internet Protocol Journal, vol. 1, No. 3, Dec. 1998.
Notice of Allowability for U.S. Appl. No. 12/882,059 dated May 30, 2013.
Notice of Allowability for U.S. Appl. No. 12/882,059 dated Feb. 14, 2013.
Office Action for U.S. Appl. No. 12/882,059 dated May 11, 2012.
Notice of Allowability for U.S. Appl. No. 14/038,684 dated Aug. 1, 2014.
Office Action for U.S. Appl. No. 14/038,684 dated Mar. 17, 2014.
Office Action for U.S. Appl. No. 14/217,249 dated Apr. 21, 2016.
Notice of allowance/allowability for U.S. Appl. No. 14/217,467 dated Apr. 20, 2016.
Notice of allowance/allowability for U.S. Appl. No. 14/214,216 dated Apr. 27, 2016.
Notice of allowance/allowability for U.S. Appl. No. 14/217,436 dated May 6, 2016.
Advisory Action for U.S. Appl. No. 14/690,305 dated Nov. 25, 2016.
Notice of Allowance for U.S. Appl. No. 14/217,096 dated Dec. 5, 2016.
Notice of Allowance for U.S. Appl. No. 14/217,161 dated Dec. 30, 2016.
Office Action for U.S. Appl. No. 14/866,946 dated Jan. 5, 2017.
Office Action for U.S. Appl. No. 14/688,209 dated Jan. 11, 2017.
Amazon Route 53 Developer Guide API Version Apr. 1, 2013, copyright 2017 by Amazon Web Services.
Host Bus Adapters (HBAs): What you need to know about networking workhorse by Alan Earls, Feb. 2003.
Office Action for U.S. Appl. No. 14/690,243 dated Jan. 13, 2017.
Office Action for U.S. Appl. No. 14/232,801 dated Jan. 19, 2017.

* cited by examiner

EMBEDDED SYSTEM BOOT FROM A STORAGE DEVICE

CROSS-REFERENCE(S) TO RELATED APPLICATIONS

This application claims the benefit of and priority to U.S. Provisional Application 61/980,564, filed 16 Apr. 2014 and is a Continuation-in-Part (CIP) of U.S. patent application Ser. No. 14/217,365 which claims benefit of and priority to U.S. Provisional Application 61/801,952, filed 15 Mar. 2013. The above Applications are hereby fully incorporated herein by reference.

This application is a continuation in part of U.S. application Ser. No. 14/217,365 which claims the benefit of and priority to U.S. Provisional Application 61/801,952, filed 15 Mar. 2013. This U.S. Provisional Application 61/801,952 and U.S. application Ser. No. 14/217,365 are hereby fully incorporated herein by reference.

FIELD

Embodiments of the invention relate generally to computers having a single or multiple Central Processing Units (CPU) or processors. Embodiments of the invention relate more particularly to a method and device for booting such a system directly from a storage device.

DESCRIPTION OF RELATED ART

The background description provided herein is for the purpose of generally presenting the context of the disclosure of the invention. Work of the presently named inventors, to the extent the work is described in this background section, as well as aspects of the description that may not otherwise qualify as prior art at the time of filing, are neither expressly nor impliedly admitted as prior art against this present disclosure of the invention.

An embedded system refers to an apparatus that is made up of a single or multiple controller chips interconnected to each other on a printed circuit board. A controller chip can have one or more central processing unit (CPU) that enables the controller chip to interpret and execute code. When an embedded system has more than one processor, the embedded system is already called a multiprocessor system. The term embedded system will be used to refer to a single CPU or a multiprocessor system in this disclosure.

A conventional embedded system contains a nonvolatile memory which is used to store firmware that is read and executed by a CPU to initialize the embedded system. The nonvolatile memory can be a read-only memory (ROM), one-time programmable memory (OTP), programmable read only memory (PROM), electrically erasable PROM (EEPROM), or a flash PROM (FPROM). The nonvolatile memory can be internal (on-chip) or external (off-chip) to the controller chip. The firmware stored in the nonvolatile memory can be a boot code loader, a basic input/output system (BIOS), an operating system (OS), or an application firmware. The boot code loader is a small code executed by a CPU to do minimum initialization of the system. After initialization, the boot code loader copies the BIOS or OS or application firmware from a mass storage device external to the embedded system to the random access memory (RAM) of the system. When the BIOS or OS or application firmware is already loaded in the RAM, the CPU reads and executes the BIOS or OS or application firmware to do exhaustive initialization and diagnostics before proceeding to normal system operation. A mass storage device can be a rotating disk drive or a solid-state drive (SSD) which is made up of FPROM devices. Though nonvolatile memory size can be reduced due to a small boot code loader, the boot code loader does not have the ability to self-check an integrity of the boot code loader.

In an invention described in US Patent Application Publication number US 2005/0120146 A1, which was published on 2 Jun. 2005, now U.S. Pat. No. 7,103,684, which was issued on 5 Sep. 2006, an embedded system in FIG. 1 that does not have an on-chip nonvolatile memory such as a read only memory (ROM) directly boots from flash block mass storage 106. The flash block mass storage 106 is a collection of flash chips interfaced to the flash memory controller 105. The apparatus makes use of a Flash Programming Engine, embedded within a Flash memory controller 105, the first device that is taken out of reset, to program a Direct Memory Access controller 104 to transfer a boot code loader from flash block mass storage 106 to an internal Random Access Memory (RAM) 103. When the transfer of the boot code loader to the RAM 103 is completed the internal Central Processing Unit 101 of the controller chip is taken out of reset to read and execute the boot code loader in the RAM 103. The boot code loader performs initialization of the system, power-on self-tests, and copies a much larger control program or application firmware from the flash block mass storage 106 to the RAM 103.

SUMMARY

Embodiments of the invention described in this disclosure make use of a minimum amount of non-volatile memory in order to boot an embedded system. Reduction in size of the nonvolatile memory brings about an advantage in terms of cost and complexity. An embodiment of the invention also allows the system to verify the integrity of data and code used in the boot process.

In some cases, the configuration registers of an embedded system may need to be initialized even before any of the CPU (processor) of the system is brought out of reset to begin execution of the system firmware. Embodiments of the invention presented in this disclosure will also address this issue of pre-initialization.

An embodiment of the invention provides a mechanism for booting up a system using a minimum amount of nonvolatile memory. This method also enables the embedded system to initialize all configuration registers even before any of the CPUs (processors) of the system is brought out of reset. The embedded system comprises multiple controller chips or a single controller chip. The embedded system can have a single or multiple central processing units (processors).

An embodiment of the invention comprises at least one Central Processing Unit (CPU) (or processor) which reads and executes firmware; a random access memory (RAM) which is used to temporarily store firmware; a memory controller which provides an interface to the RAM; a Reset Controller which maintains the reset states of all the devices of the embedded system; a Power-On Reset Sequencer which controls the overall boot process of the embedded system; a nonvolatile memory (e.g., ROM) and nonvolatile memory controller used to store data used by the Power-On Reset (POR) Sequencer in the boot process; at least one direct memory access (DMA) controller which initiates and tracks data transfers; a storage device controller which provides an interface to the storage device; a CPU bus which interconnects the devices of the system; and a storage device which is used to store system firmware; a debug interface used to pre-program the nonvolatile memory, and a storage device with data and code.

An embodiment of the invention describes the structure of the Power-On Reset (POR) Sequencer and the operation of the POR sequencer. The POR Sequencer makes use of a POR Sequencer Descriptor which is a preassembled descriptor that is stored in a nonvolatile memory of the system. The POR Sequencer descriptor contains register information and direct memory access (DMA) controller descriptors. The register information are read and used by the POR Sequencer to update the configuration registers of the system. The DMA descriptors are loaded by the POR Sequencer to the DMA controllers of the system. The POR Sequencer facilitates the boot process and takes care of verifying the integrity of loaded data and code in the RAM.

The POR Sequencer Descriptor in an embodiment of the invention is not limited to a single data structure. A linked-list of data structures is presented to increase the amount of register information and DMA descriptors available for processing by the POR Sequencer.

An embodiment of the invention also provides a method of copying a POR Sequencer Descriptor from nonvolatile memory to the RAM and verifying an integrity of the POR Sequencer Descriptor; a method of initializing the configuration registers by the POR Sequencer; a method of copying the system firmware from the storage device to the RAM; and a method of releasing the CPUs (processors) of the system from reset.

Initially, a nonvolatile memory of the system and storage device contain nothing. When the system is powered up, no boot process occurs but the debug interface and a CPU (processor) are released from reset. The system integrator loads a program to the RAM via the debug interface. The program contains code to burn the POR Sequencer Descriptor in nonvolatile memory and to save a copy of the System Firmware in the storage device.

The method of copying a POR Sequencer Descriptor from nonvolatile memory to RAM starts when the supply voltage of the system becomes stable after power-up. Then the Reset Controller, the POR Sequencer, the CPU Bus, the memory controllers, the DMA controllers, and the storage device controllers are released from reset. Then the POR Sequencer detects the presence of the POR Sequencer Descriptor in the nonvolatile memory. If the POR Sequencer Descriptor is not detected, then the debug interface and a CPU (processor) of the system are released from reset. If the POR Sequencer Descriptor is detected, then the POR Sequencer copies the POR Sequencer Descriptor from nonvolatile memory to RAM. This operation ends after the verification of the copied POR Sequencer Descriptor to the RAM is completed without error.

The method of initializing the configuration registers of the system starts when the first register information of the POR Sequencer Descriptor is read. Then the register indicated by the register information is updated with a new set of configuration. This sequence is repeated until the last register information of the POR Sequencer Descriptor is read and processed. Then the operation proceeds to the processing of the DMA descriptor. The type of the DMA descriptor is identified by the POR Sequencer. If the DMA descriptor points to another set of register information then the DMA transfer will update the register information and DMA descriptor spaces of the current POR Sequence Descriptor in the RAM. If the DMA descriptor points to a system firmware fragment, then this operation is ended and the sequence proceeds to the next method.

The next method is an operation where the system firmware stored in the external storage device is copied to the RAM of the embedded system. The system firmware can be a boot code loader, a BIOS, an operating system, or a plain application firmware. This operation starts when the POR Sequencer identifies that the DMA descriptor points to a system firmware fragment. The POR Sequencer loads the DMA or DMAs with the DMA Descriptors that will copy the system firmware fragments to the RAM. The POR Sequencer waits for completion signals from all DMA controllers that have been loaded with DMA descriptors before proceeding in the process flow. If the last DMA descriptor of the current POR Sequencer Descriptor points to another set of DMA Descriptors then another set of system firmware fragments are copied from the storage devices to the RAM. If the last DMA descriptor of the current POR Sequencer Descriptor points to the last system firmware fragment, then this operation ends. The storage device refers to a single storage device or a plurality of storage devices of the same type.

The last operation is the release of the CPUs (processors) of the embedded system from reset. When the system has a single CPU (processor), after the system firmware is loaded in the RAM, the POR Sequencer configures the reset controller to release the CPU from reset. Then the CPU starts reading and executing the system firmware. In a multi-CPU (multi-processor) system, a CPU (processor) is released from reset. Then, the CPU reads and executes the system firmware in the RAM. The system firmware will have instructions to sequence the release of the other CPUs from reset either one at a time or simultaneously.

In an embodiment of the invention, In an embodiment of the invention, an apparatus comprises an embedded system comprising: a processor configured to execute firmware; a random access memory (RAM) configured to store firmware and a multi-port memory controller configured to interface with the RAM; a power-on reset (POR) sequencer configured to control a boot process of the embedded system; a nonvolatile memory configured to store data used by the POR sequencer in the boot process and a nonvolatile memory controller configured to interface with the nonvolatile memory; a direct memory access (DMA) controller configured initiate and track data transfers; and a configuration and status register (CSR) controller configured to access modules in the embedded system.

In another embodiment of the invention, a method comprises: booting up an embedded system using a minimum amount of nonvolatile memory, including accessing modules in the embedded system.

In yet another embodiment of the invention, an article of manufacture, comprises: a non-transient computer-readable medium having stored thereon instructions that permit a method comprising: booting up an embedded system using a minimum amount of nonvolatile memory, including accessing modules in the embedded system.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) of the invention and together with the description, serve to explain the principles of the invention.

BRIEF DESCRIPTION OF DRAWINGS

Non-limiting and non-exhaustive embodiments of the present invention are described with reference to the following figures, wherein like reference numerals refer to like parts throughout the various views unless otherwise specified.

It is to be noted, however, that the appended drawings illustrate only typical embodiments of this invention and are therefore not to be considered limiting of its scope, for the present invention may admit to other equally effective embodiments.

DETAILED DESCRIPTION

In the following detailed description, for purposes of explanation, numerous specific details are set forth to provide a thorough understanding of the various embodiments of the present invention. Those of ordinary skill in the art will realize that these various embodiments of the present invention are illustrative only and are not intended to be limiting in any way. Other embodiments of the present invention will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual implementation, numerous implementation-specific decisions may be required to achieve specific design objectives. These design objectives will vary from one implementation to another and from one developer to another. Moreover, it will be appreciated that such a development effort might be complex and time-consuming, but would nevertheless be a routine engineering undertaking for those of ordinary skill in the art having the benefit of this disclosure. The various embodiments disclosed herein are not intended to limit the scope and spirit of the herein disclosure.

Exemplary embodiments for carrying out the principles of the present invention are described herein with reference to the drawings. However, the present invention is not limited to the specifically described and illustrated embodiments. A person skilled in the art will appreciate that many other embodiments are possible without deviating from the basic concept of the invention. Therefore, the principles of the present invention extend to any work that falls within the scope of the appended claims.

As used herein, the terms "a" and "an" herein do not denote a limitation of quantity, but rather denote the presence of at least one of the referenced items.

In the following description and in the claims, the terms "include" and "comprise" are used in an open-ended fashion, and thus should be interpreted to mean "include, but not limited to . . . ". Also, the term "couple" (or "coupled") is intended to mean either an indirect or direct electrical connection. Accordingly, if one device is coupled to another device, then that connection may be through a direct electrical connection, or through an indirect electrical connection via other devices and/or other connections.

Embodiments of the invention relate to a method and device for booting up a system from a storage device. Embodiments of the invention also relate to a method for enabling a system to initialize all configuration registers even before any of the CPUs (processors) of the system is brought out of reset.

Figure 1:
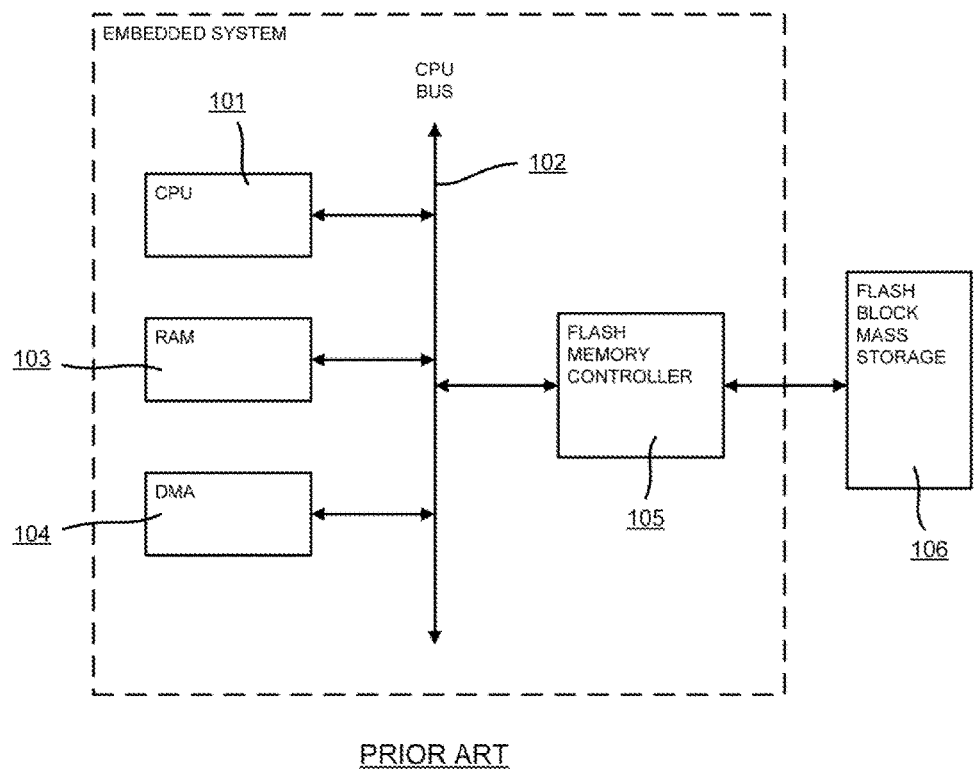
FIG. 1 shows a conventional embedded system that implements a mechanism to directly boot from flash block mass storage.
Figure 2:
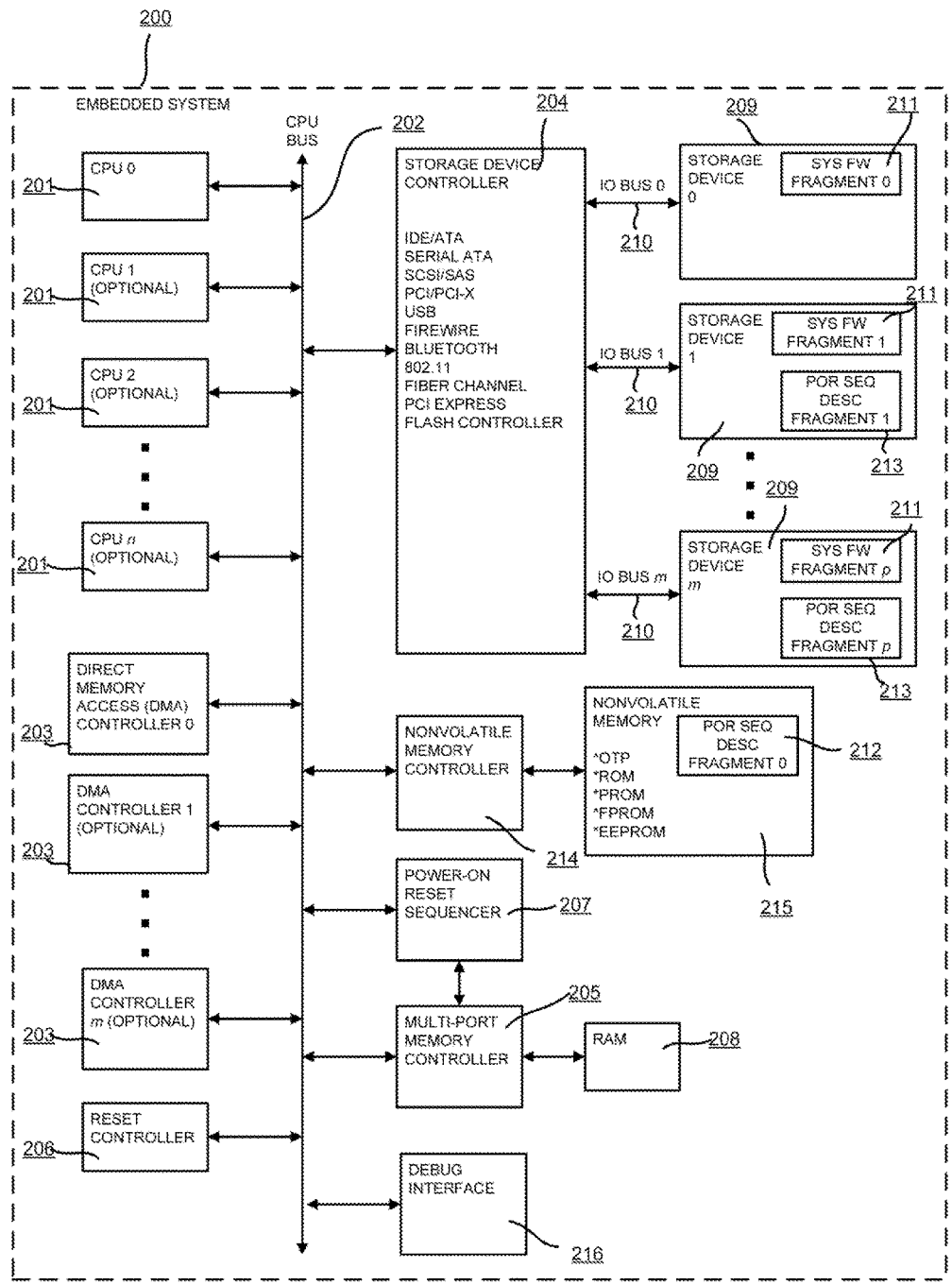
FIG. 2 is a block diagram of an embedded system with a power-on reset sequencer that manages the initialization and boot up of the system, in accordance with an embodiment of the invention.

FIG. 2 is a block diagram showing an exemplary embodiment of the invention. The block diagram in the figure shows an embedded system 200 comprising a CPU (Central Processing Unit) bus 202 interconnecting a single CPU 201 (or processor 201) or a plurality of CPUs 201, a single DMA controller 203 or a plurality of DMA controllers 203, a reset controller 206, a power-on reset (POR) sequencer 207, a RAM controller 205, a nonvolatile memory controller 214, a storage device controller 204, and a debug interface 216. Also, the system 200 comprises an internal RAM 208, a small nonvolatile memory 215, and a storage device 209. A storage device 209 type may be a mechanical disk drive, a mobile flash drive, or a solid-state drive (SSD).

The storage device controller 204 controls the storage device 209 or devices 209 connected to the storage device controller 204. A storage device 209 or a plurality of storage devices 209 are connected to the storage device controller 204 via an IO (input/output) bus 210 for the case of interface standards such as IDE/ATA, Serial ATA, SCSI/SAS, PCI/PCI-X, USB, Firewire, Bluetooth, Fibre Channel and PCI Express. For a solid-state drive, a flash bus is used to connect to the storage device controller 204 which also called a flash controller 204. The reset controller 206 handles the reset states of all the devices (as shown in FIG. 2) in the embedded system 20.

One DMA controller 203 or a plurality of DMA controllers 203 initiates and tracks data transfers. The storage device controller 204 provides an interface to the storage device 209. The storage device 209 is used to store system firmware 211 or a fragment of the system firmware 211. When the POR sequencer descriptor exceeds the space of the nonvolatile memory 215, the descriptor is divided into fragments 212, 213 and distributed across the nonvolatile memory 215 and storage devices 209.

The multi-port memory controller 205 interfaces the RAM 208 to the CPU bus 202 and to the POR sequencer 207. The POR sequencer 207 processes the POR sequencer descriptor which contains information to initialize configuration registers of the embedded system 200 and DMA descriptors used to fetch other POR sequencer descriptor fragments 213 and the system firmware 211. The POR sequencer 207 takes care of loading the system firmware 211 to the RAM 208 and verifying an integrity of the system firmware 211. After the system firmware 211 has been loaded in the RAM 208 and the configuration registers of the embedded system 200 are pre-initialized, the POR sequencer 207 sequences the release of the CPUs 201 from their reset states.

The nonvolatile memory 215 with the nonvolatile memory controller 214 is used to store the head of the POR sequencer descriptor 212 that is used by the POR sequencer 207 in the boot process. Initially, the nonvolatile memory 215 of the embedded system 200 and storage devices 209 that are attached to the embedded system 200 are empty. When the system 200 is powered up, the boot process exits to emulation mode since there are no POR sequencer descriptor to process and no system firmware 211 to load and execute in memory. The system integrator which writes program for the embedded system 200 loads a firmware to the RAM 208 of the system 200 via the debug interface 216. The firmware loaded in the RAM 208 has a routine that writes the POR sequencer descriptor and system firmware 211 to the nonvolatile memory 215 and storage devices 209 attached to the system 200. After the POR sequencer descriptor and system firmware 211 has been written to the nonvolatile memory 215 and storage devices 209, the next time the system 200 is powered up, the system 200 does not exit to emulation mode and instead the system 200 continues with the boot process until all CPUs 201 of the system 200 are released from their reset states. The firmware stored in the nonvolatile memory 215 can be a boot code loader, a BIOS, an OS, and/or an application firmware.

Figure 2A:
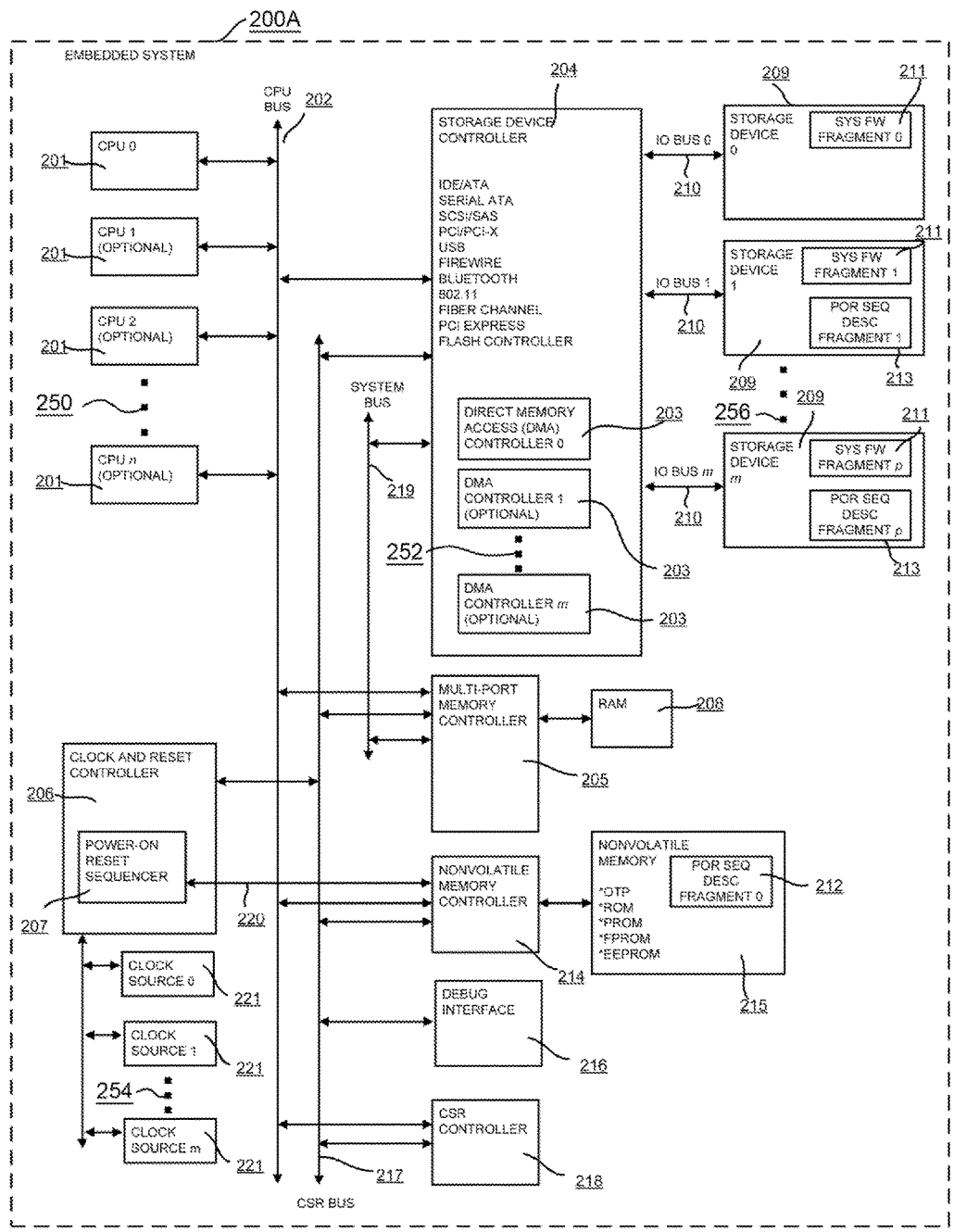
FIG. 2A is a block diagram of an embedded system, in accordance with another embodiment of the invention.

FIG. 2A is a block diagram of an embedded system 200A, in accordance with another embodiment of the invention. The embedded system 200A also has similar components and configuration as those described for the embedded system 200 in FIG. 2 except for the differences discussed below. The system 200A comprises a single CPU (0) 201 (processor (0) 201) or an n+1 number of CPUs (processors) 201 wherein n is an integer. The CPUs 201 can vary in number as noted by, for example, the dot symbols 250.

The operations of the embedded system 200A in FIG. 2A is as follows.

1. Power is supplied to a chip that includes the embedded system 200A.

2. Clock and Reset Controller 206 or CrCORE (which is implemented by the system 200A) waits for a crystal oscillator in the system 200A to stabilize.

3. CrCORE releases the nonvolatile memory controller 214, CPU bus 202, CSR bus 217, CSR controller 218, and multi-port memory controller 205 from the reset state.

4. POR sequencer 207 waits for above modules (nonvolatile memory controller 214, CPU bus 202, CSR bus 217, CSR controller 218, and multi-port memory controller 205) to be ready.

5. POR sequencer 207 commands the nonvolatile memory controller 214 through (via) sideband signal 220 to start searching for a bootstrap code loader stored in the nonvolatile memory 215.

6. Nonvolatile memory controller 214 searches for the latest instance/copy of the strap configuration and bootstrap code loader, wherein the latest instance or latest copy of the strap configuration and bootstrap code loader are stored in the nonvolatile memory 215.

7. Nonvolatile memory controller 214 maps the system address 0x0000 to this latest copy of the strap configuration and bootstrap loader.

8. Nonvolatile memory controller 214 informs the POR sequencer 207, through sideband signal 220 that the bootstrap code loader is ready.

9. This sideband signal 220 causes the clock and reset controller 206 to release the master CPU 201 (e.g., CPU (0) 201) from reset (i.e., reset state).

10. Master CPU (0) 201 reads the bootstrap code from nonvolatile memory 215.

11. Reading of bootstrap code by the master CPU (0) 201 also causes the nonvolatile memory controller 214 to check for data errors in the bootstrap code.

12. As part of the bootstrap code, CPU (0) 201 configures the clock sources 221 in the embedded system 200A via CSR access across the CSR bus 217.

13. CPU (0) 201 waits for the ready status of the clock sources 221.

14. CPU (0) 201 then releases from reset other modules (or elements) that are necessary for system firmware transfer, wherein these other modules or elements comprise the storage device controller 204, system bus 219, and multiport memory controller 205.

15. CPU (0) 201 instructs the DMA controller 203 to move firmware from the storage device 209 to the RAM 209 via the system bus 219. The DMA controller 203 can be one or more in number and can vary in number as noted, for example, the dot symbols 252. For example, there can be a single DMA controller (0) 203 in the embedded system 200A or there can be an m+1 number of DMA controllers 203 in the embedded system 200A, wherein m is an integer.

16. CPU (0) 201 releases remaining modules from reset state.

17. CPU (0) 201 remaps the system address 0x0000 from the nonvolatile memory 215 to the RAM 208.

18. The system firmware then starts running in the embedded system 200A.

Additional definitions in the embedded system 200A also includes the following.

The Clock and reset controller 206 handles the reset states of all the devices in the embedded system 200A and controls the clock sources used in the chip that includes the embedded system 200A.

The CSR bus 217 comprises a bus primarily used by the CPU(s) 201 to access the configuration and status registers of modules in the chip that includes the embedded system 200A.

The CSR (configuration and status register) controller 218 provides an interface for the CPU(s) 201 to access the configuration and status registers of modules in the chip that includes the embedded system 200A. These modules comprises the nonvolatile memory controller 214, CPU bus 202, CSR bus 217, storage device controller, and multi-port memory controller 205

The System bus 219 comprises a bus connecting the storage device controller 204 to the multiport memory controller 205.

The Sideband signals 220 comprises exclusive signals between the POR sequencer 207 and the nonvolatile memory controller 214.

The clock sources 221 produces clocking signals, usually, for example, phase-locked loops (PLL) signals. The clock sources 221 can be an m+1 number of clock sources 221 in the embedded system 200A as noted by, for example, the dot symbols 254, or the embedded system 200A comprises a single clock source (0) 221.

Other elements in the embedded system 200A such as, for example, the I/O bus 210, system firmware fragments 211, debug interface 216, and POR sequence descriptor fragments 212 and 213 were similarly described above with reference to the embedded system 200 in FIG. 2. The storage devices 209 can vary in number as noted, for example, by the dot symbols 256. For example, the embedded system 200A can include a single storage device (0) 209 or an m+1 number of storage devices 209. If there is an m+1 number of storage devices 209 in the embedded system 200A, then there are a p number of system firmware fragments 211 and a p number of POR sequence descriptor fragments 213, wherein p=m+1.

Figure 3:
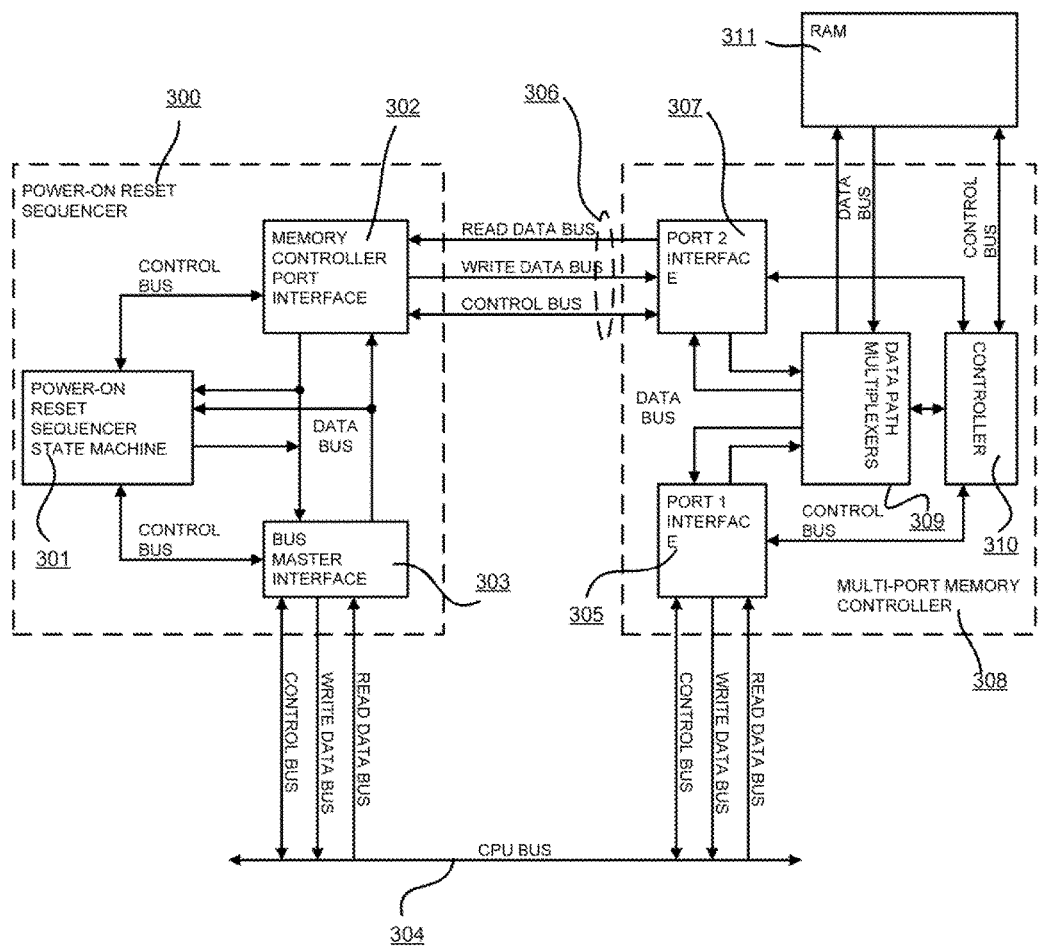
FIG. 3 is a block diagram which presents the internal organization of the power-on reset sequencer and the interconnection of the power-on reset sequencer to the RAM via a memory controller, in accordance with an embodiment of the invention.

FIG. 3 is a schematic diagram that illustrates the structure and interconnection between the POR sequencer 300 and the multi-port memory controller 308, in accordance with an embodiment of the invention. For the POR sequencer 300, data and control signals to and from the CPU bus 304 are managed by the bus master interface 303 while control signals to and from the RAM 311 are managed by the memory controller port interface 302. The POR sequencer state machine 301 utilizes the bus master interface 303 to perform data transfer to and from the CPU bus and the memory controller port interface 302 to do data transfer to and from the RAM 311. The POR sequencer 300 combines the use of the bus master interface 303 and the memory controller port interface 302 in order to control transfers to and from the RAM 311.

The POR sequencer 300 transfers the POR sequencer descriptor from the nonvolatile memory or from the storage device to the RAM 311 before the POR sequencer descriptor is processed. When the POR sequencer descriptor is already loaded in the RAM 311, the POR sequencer state machine reads a part of the descriptor from RAM to parse and interpret. Depending on the content of the part of the POR sequencer descriptor, the POR sequencer state machine decides whether to get another part of the descriptor from RAM, transfer data from RAM to a device mapped on the CPU bus 304, or to write data that the POR sequencer state machine generated to the RAM or to a device mapped on the CPU bus 304. Through the use of POR sequencer state machine 301, memory controller port interface 302, and bus master interface 303 the POR sequencer 300 is able to do the following tasks: transfer of DMA controller descriptor to the DMA controller's configuration register space, activation of the DMA controller, initialization of configuration registers, and copy of data from storage device or nonvolatile memory to the RAM.

The multi-port memory controller 308 has several port interfaces. Port 1 interface 307 provides devices on the CPU bus 304 access to the RAM 311. Port 2 interface provides the POR sequencer 300 access to the RAM 311. The data path multiplexers 309 route the read and write requests from the POR sequencer 300 and the CPU bus 304 to the RAM 311. The controller 310 manages how the data path multiplexers 309 behave in response to the read and write requests received from the POR sequencer 300 and CPU bus 304.

Figure 4:
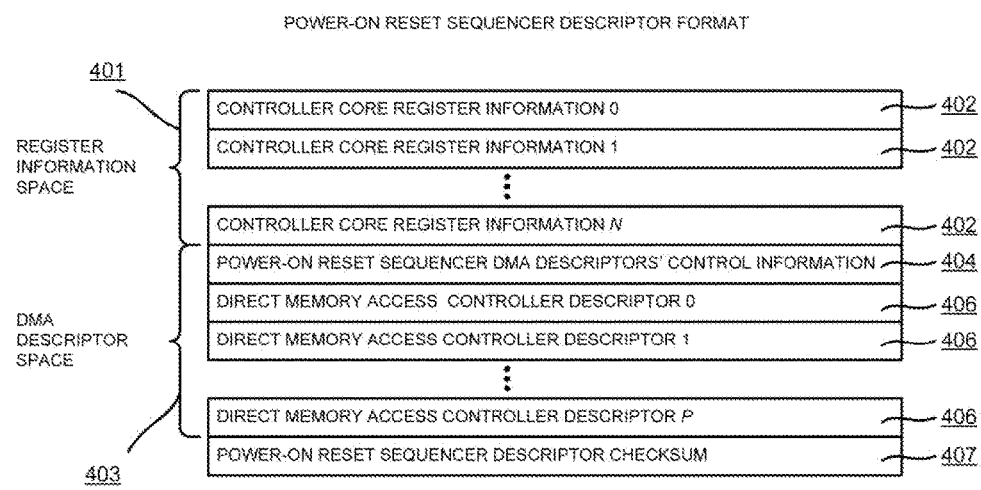
FIG. 4 shows the structure of the power-on reset sequencer descriptor, in accordance with an embodiment of the invention.

FIG. 4 shows the POR sequencer descriptor format, in accordance with an embodiment of the invention. The POR sequencer descriptor is comprised of the register information space 401, the DMA descriptor space 403, and an optional POR sequencer descriptor checksum 407. The register information space consists of controller core register information 402 used by the POR sequencer to update the configuration registers of the system. The DMA descriptor space 403 on the other hand consists of the POR sequencer DMA descriptors' control information 404 and one or more DMA controller descriptors 406. The DMA controller descriptors 406 are loaded by the POR Sequencer to the DMA controller's configuration register space. The POR sequencer DMA descriptors' control information 404 contains information about the DMA controller descriptors 406 of the current POR sequencer descriptor.

Figure 5:
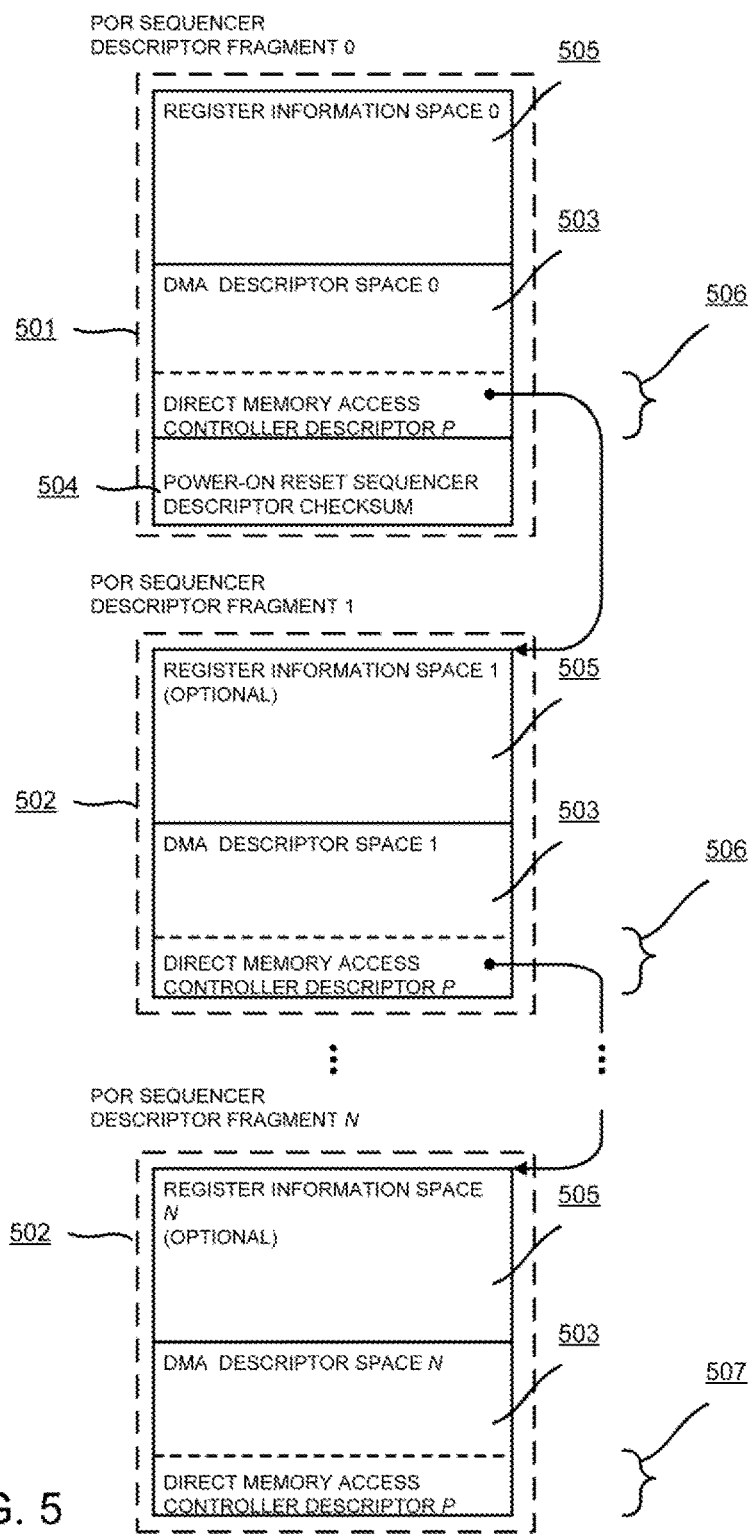
FIG. 5 illustrates a linked-list data structure of the power-on reset sequencer descriptor, in accordance with an embodiment of the invention.

When the POR sequencer descriptor does not fit in the nonvolatile memory of the system, the descriptor is divided into fragments and distributed across the nonvolatile memory and storage devices attached to the system. FIG. 5 provides an illustration of a fragmented POR sequencer descriptor, in accordance with an embodiment of the invention. POR sequencer descriptor fragment 0 501 is stored in the nonvolatile memory. Fragment 0 comprises of register information space 505, DMA descriptor space 503, and POR sequencer descriptor checksum 504. The DMA descriptor space 503 is composed of DMA controller descriptors 0 to P. The last DMA controller descriptor 506 of the POR sequencer descriptor fragment 501, 502 points to the next POR sequencer descriptor fragment 502. POR sequencer fragment 1 to N 502 have only two parts, the register information space 505 and DMA descriptor space 503 in contrast to POR sequencer descriptor fragment 0 501 which is made up of three parts. The POR sequencer descriptor fragment 501 or 502 may or may not have a register information space 505. The last DMA controller descriptor 507 of the last POR sequencer descriptor fragment points to the last fragment of the system firmware in the storage device.

Figure 6:
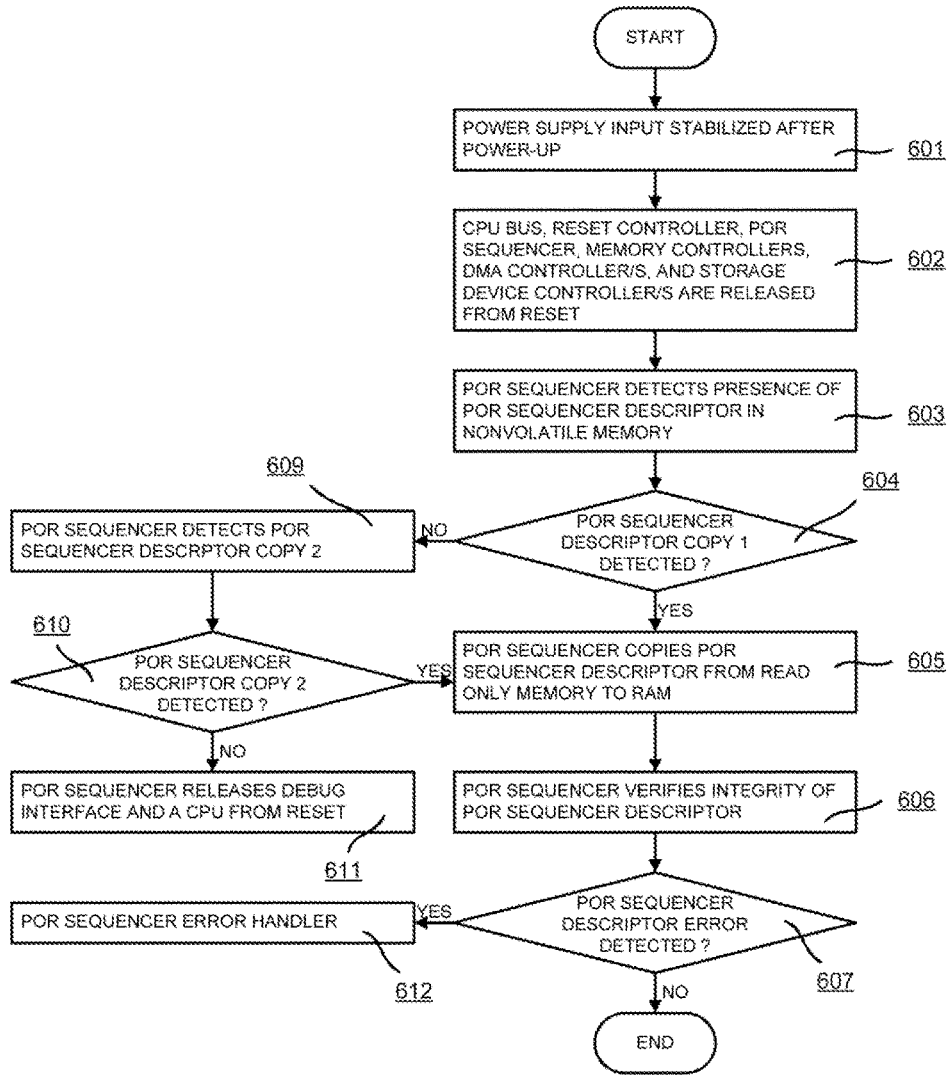
FIG. 6 is a flow chart of the sequence used in copying the power-on reset sequencer descriptor from a nonvolatile memory to the RAM, in accordance with an embodiment of the invention.

FIG. 6 is a flowchart showing the process of transferring the POR sequencer descriptors 212, 213 from nonvolatile memory 215 and storage device 209 to the RAM 208, in accordance with an embodiment of the invention. After the system is powered-up and the input power supply stabilizes in block 601, the CPU bus 202, reset controller 206, DMA controller 203, storage device controller 204, RAM controller 205, nonvolatile memory controller 214 and POR sequencer 207 are brought out of reset in block 602. The POR sequencer 207 then detects the presence of POR sequencer descriptor 212 in the nonvolatile memory in block 603. If the first copy of the POR Sequencer descriptor 212 is detected, then POR sequencer 207 copies the POR sequencer descriptor 212 from the nonvolatile memory 215 to the RAM 208 in block 606. POR sequencer 207 then checks the integrity of POR sequencer descriptor 212 in block 606 by comparing the computed checksum to the POR sequencer descriptor checksum 507. If no error is found then copying of POR sequencer descriptor 212 from nonvolatile memory 215 to the RAM 208 is completed. If an error is found, a POR sequencer error handler is activated in block 612. If the first copy 212 is unsuccessfully detected at operation 604, in block 609, the POR sequencer will try to detect a second copy of the POR sequencer descriptor which is not shown in FIG. 2. If successful, the POR sequencer 207 will copy the backup copy of the POR sequencer descriptor from the nonvolatile memory 215 to the RAM 208 in block 605. If not, the POR sequencer 207 releases the debug interface 216 and a CPU 201 from reset to allow a system integrator from updating the nonvolatile memory 215 with a new POR sequencer descriptor 212.

Figure 7:
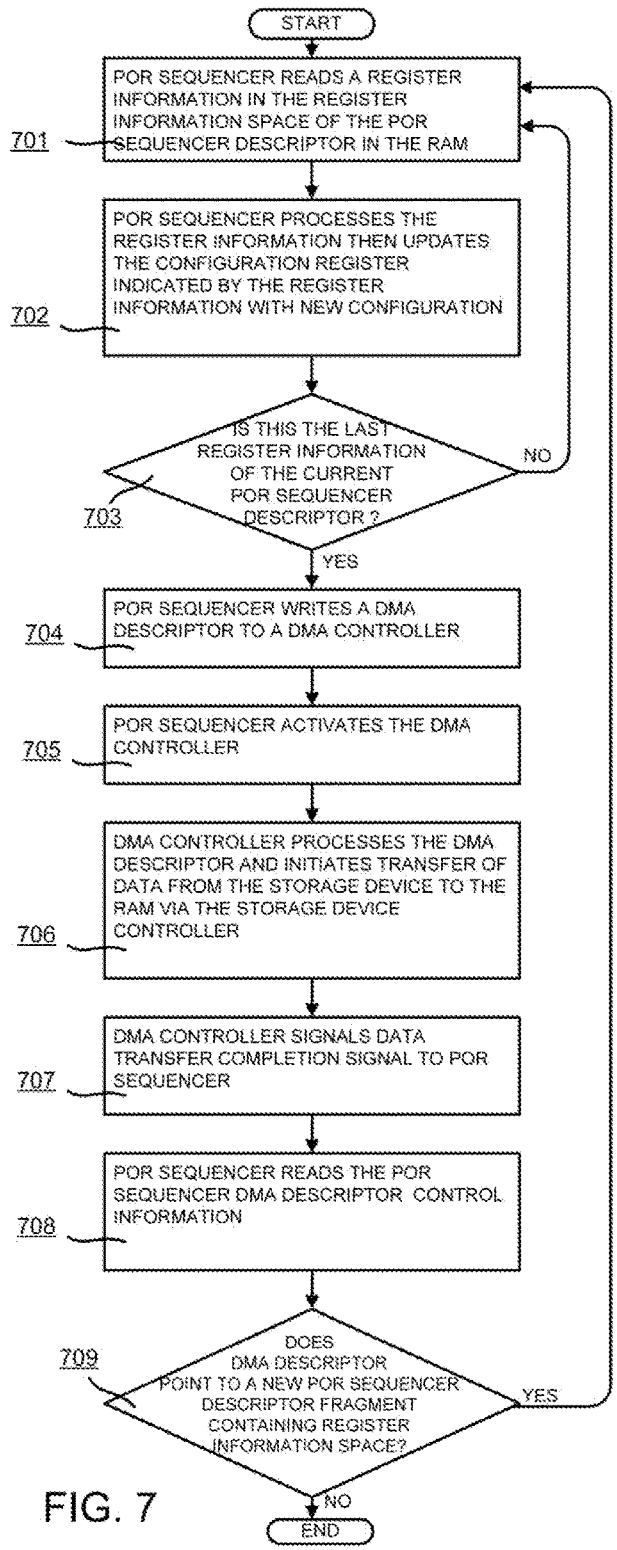
FIG. 7 is a flow chart of the sequence used in the register initialization phase of the power-on reset sequencer, in accordance with an embodiment of the invention.

FIG. 7 illustrates the register initialization phase by the POR sequencer 207, in accordance with an embodiment of the invention. Starting from block 701, the POR sequencer 207 reads the first register information in the register information space 401 of the POR sequencer descriptor 212 from the RAM 208. The POR sequencer 207 then processes the register information and then updates the corresponding configuration register based on the contents of the register information in block 702. Operations 701 and 702 are repeated for succeeding register information until the last register information of the current POR sequencer descriptor 212 is read and processed. After the last register information is read, the POR sequencer 207 writes the DMA controller descriptor 406 to the DMA controller's register space in block 704. The POR sequencer 207 then activates the DMA controller 203 in block 705. The DMA controller 203 then processes the DMA controller's descriptor 406 that the DMA controller 203 received and initiates transfer of data from the storage device 209 to the RAM 208 via the storage device controller 204 in block 706. When the data transfer is finished, in block 707, the DMA controller 203 informs the POR sequencer 207 that the data transfer has completed. The POR sequencer 207 then reads the POR sequencer DMA descriptor's control information 404 in block 608. The POR sequencer 207 then checks if the DMA controller descriptor 406 points to a new set of register information of another POR sequencer descriptor fragment 502 in block 709. If the test is positive, the register initialization phase is repeated starting with block 701. If the test is negative, then the register initialization phase has ended.

Figure 8:
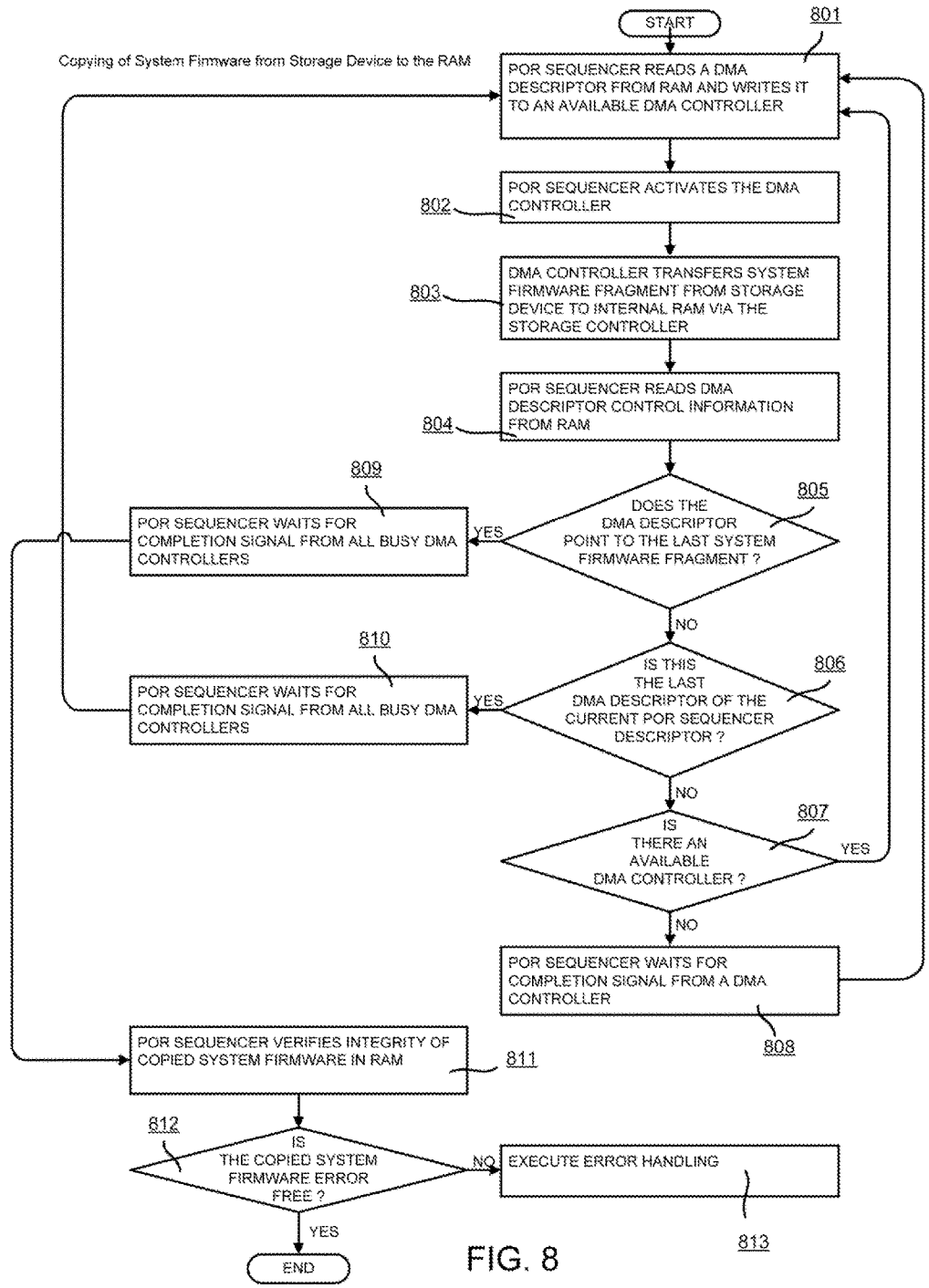
FIG. 8 is a flow chart of the sequence used in copying the system firmware from the storage device to the RAM, in accordance with an embodiment of the invention.

DMA controller descriptors 406 are not only used to fetch POR sequencer descriptor fragments 501, 502. They are also used to transfer system firmware 211 from the storage device to the RAM 208. In FIG. 8, the copying of system firmware 211 from the storage device 209 to the RAM 208 is illustrated, in accordance with an embodiment of the invention. The process, in this embodiment of the invention, starts with the POR sequencer 207 reading a DMA controller descriptor 406 from RAM 208 and then writing the DMA controller descriptor 406 to the configuration space of an available DMA controller 203 in block 801. The POR sequencer 207 then activates the DMA controller 203 in block 802, which would then cause the DMA controller 203 to start the transfer of a system firmware fragment 211 from the storage device 209 to the internal RAM 208 via the storage device controller 204 in block 803.

The POR sequencer 207 then reads the DMA descriptor control information 404 from RAM 208 in block 804. If the DMA descriptor 406 points to the last system firmware fragment, the POR sequencer 207 waits for all busy DMA controllers to complete their transfers in block 809. The POR sequencer 207 then verifies the integrity of the copied system firmware in block 811. If the system firmware is error free then the sequence completes. If an error is found, an error handling routine will be executed in block 813. In block 805, if the DMA controller descriptor 406 does not point to the last system firmware fragment, which means there are succeeding system firmware fragments, then the POR sequencer 207 proceeds to block 806 to check if the said DMA controller descriptor 406 was the last descriptor of the current POR sequencer descriptor. If it is the last DMA controller descriptor 406 of the current frame, then POR sequencer 207 waits for all the busy DMA controllers to complete their transfers in block 810. The process is repeated starting from block 801 for the next POR sequencer descriptor which will be used to fetch the next system firmware fragment 211.

In block 806, if the DMA controller descriptor 406 of the current POR sequencer descriptor is not the last one, then the availability of a DMA controller 203 is determined in block 807. If there is no available DMA controller, meaning, all the DMA controllers 203 are busy, then the POR sequencer 207 waits for a DMA controller 203 to complete the transfer performed by DMA controller 203 in block 808 before proceeding to process the next DMA controller descriptor 406. When a DMA controller becomes available the process goes back to block 801.

Figure 9:
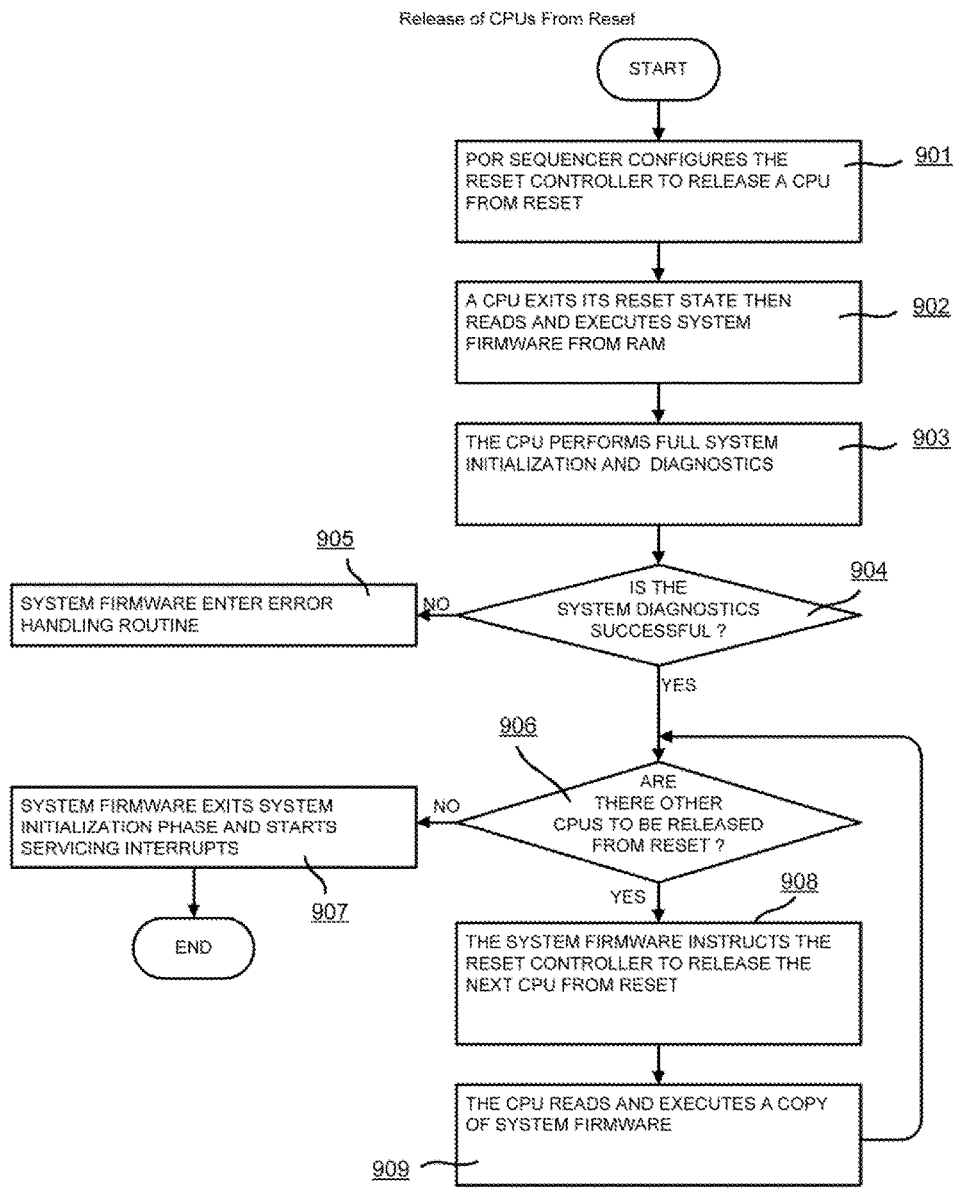
FIG. 9 is a flow chart of the sequence used in releasing the CPUs (processors) of the embedded system from their reset states, in accordance with an embodiment of the invention.

FIG. 9 describes the process of releasing the CPUs 201 from their reset state, in accordance with an embodiment of the invention. The POR sequencer 207 first configures the reset controller 206 to release a CPU 201 from reset in block 901. This CPU is usually referred to as the bootstrap CPU. After coming out of reset, the bootstrap CPU reads and executes the system firmware from RAM 208 in block 902. Then the bootstrap CPU performs full system initialization and diagnostics in block 903. If the diagnostic failed, a system firmware error handling routine is executed in block 905. If the system diagnostics is successful, the release of other CPUs, if present, proceeds. The system firmware instructs the reset controller 206 to release the next CPU from reset in block 908. The next CPU is released from reset which then reads and executes a copy of the system firmware in block 909. This process ends when all of the CPUs 203 have been brought out of reset. At this point, the system firmware exits system initialization phase and waits for service calls from the controller cores of the embedded system.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks, and that networks may be wired, wireless, or a combination of wired and wireless.

It is also within the scope of the present invention to implement a program or code that can be stored in a non-transient machine-readable (or non-transient computer-readable medium) having stored thereon instructions that permit a method (or that permit a computer) to perform any of the inventive techniques described above, or a program or code that can be stored in an article of manufacture that includes a non-transient computer readable medium on which computer-readable instructions for carrying out embodiments of the inventive techniques are stored. Other variations and modifications of the above-described embodiments and methods are possible in light of the teaching discussed herein.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   an embedded system comprising:
   a processor configured to execute firmware;
   a random access memory (RAM) configured to store firmware and a multi-port memory controller configured to interface with the RAM;
   a power-on reset (POR) sequencer configured to control a boot process of the embedded system, wherein the POR sequence controls the boot process and verifies an integrity of loaded data and code in the RAM;

a nonvolatile memory configured to store data used by the POR sequencer in the boot process and a nonvolatile memory controller configured to interface with the nonvolatile memory;

a direct memory access (DMA) controller configured initiate and track data transfers; and a configuration and status register (CSR) controller configured to provide an interface for the processor to access configuration and status registers of the nonvolatile memory controller, a processor bus, a CSR bus, the DMA controller, and the multi-port memory controller in the embedded system;

wherein the embedded system verifies an integrity of data and code used in the boot process and wherein the embedded system reduces an amount of the nonvolatile memory used in the boot process to provide an advantage in terms of cost and complexity.

2. The apparatus of claim 1, further comprising:
a storage device configured to store data and code.

3. The apparatus of claim 2, wherein the storage device comprises at least one solid state drive (SSD).

4. The apparatus of claim 1, wherein the POR sequencer is configured to signal the nonvolatile memory controller to search for a bootstrap code loader, and wherein the processor is configured to read bootstrap code from the nonvolatile memory; and wherein the DMA controller is configured to move firmware from the storage device to the RAM.

5. The apparatus of claim 1, wherein the nonvolatile memory comprises a read only memory (ROM).

6. The apparatus of claim 1, wherein the embedded system further comprises a debug interface configured to pre-program the nonvolatile memory.

7. The apparatus of claim 1, wherein the embedded system further comprises:

a central processing unit (CPU) bus interconnecting the processor, DMA controller, multi-port memory controller, nonvolatile memory controller, and CSR controller; and the CSR bus interconnecting the DMA controller, multi-port memory controller, nonvolatile memory controller, and CSR controller.

8. The apparatus of claim 1, wherein the processor reads bootstrap code from the nonvolatile memory.

9. The apparatus of claim 1, wherein the processor configures clock sources in the embedded system via the CSR bus.

* * * * *